(12) United States Patent
Clarke et al.

(10) Patent No.: US 12,002,773 B2
(45) Date of Patent: Jun. 4, 2024

(54) HYBRID POCKET POST AND TAILORED VIA DIELECTRIC FOR 3D-INTEGRATED ELECTRICAL DEVICE

(71) Applicant: Raytheon Company, Waltham, MA (US)

(72) Inventors: Andrew Clarke, Santa Barbara, CA (US); Chad Fulk, Santa Barbara, CA (US); Aaron M. Ramirez, Goleta, CA (US)

(73) Assignee: Raytheon Company, Tewksbury, MA (US)

( * ) Notice: Subject to any disclaimer, the term of this patent is extended or adjusted under 35 U.S.C. 154(b) by 441 days.

(21) Appl. No.: 17/190,850

(22) Filed: Mar. 3, 2021

(65) Prior Publication Data
US 2022/0285298 A1    Sep. 8, 2022

(51) Int. Cl.
*H01L 25/16* (2023.01)
*H01L 23/00* (2006.01)
(Continued)

(52) U.S. Cl.
CPC .............. *H01L 24/05* (2013.01); *H01L 24/08* (2013.01); *H01L 24/29* (2013.01); *H01L 24/32* (2013.01);
(Continued)

(58) Field of Classification Search
CPC ............... H01L 24/05; H01L 31/02002; H01L 31/0216
See application file for complete search history.

(56) References Cited

U.S. PATENT DOCUMENTS 5,365,088 A    11/1994  Myrosznyk
5,959,340 A     9/1999  Wan
(Continued)

FOREIGN PATENT DOCUMENTS

EP     0635892 B1    6/2002
WO  2007096405 A1    8/2007
(Continued)

OTHER PUBLICATIONS

Butcher K. S.. A. et al., "Predeposition ultraviolet treatment for adhesion improvement of thin films on mercury cadmium telluride", pp. 90-96, J. Vac. Sci. Thchnol. A 19(1), Jan./Feb. 2001, Copyright 2001 American Vacuum Society.
(Continued)

*Primary Examiner* — Dale E Page
*Assistant Examiner* — Wilner Jean Baptiste (57) ABSTRACT

An electrical device includes a substrate, an insulating layer supported by the substrate, and an electrically conductive vertical interconnect disposed in a via hole of the insulating layer. The insulating layer may be configured to provide a coefficient of thermal expansion (CTE) that is equal to or greater than a CTE of the vertical interconnect to thereby impart axial compressive forces at opposite ends of the interconnect. The vertical interconnect may be a hybrid interconnect structure including a low CTE conductor post having a pocket that contains a high CTE conductor contact. At low operating temperatures, the high CTE conductor contact is under tension due to the higher CTE, and thus the high CTE conductor contact relieves strain in the device by void expansion and elongation.

15 Claims, 6 Drawing Sheets

(51) Int. Cl.
*H01L 31/02* (2006.01)
*H01L 31/0216* (2014.01)
*H01L 31/0224* (2006.01)
*H01L 31/0296* (2006.01)
*H01L 31/09* (2006.01)

(52) U.S. Cl.
CPC ...... *H01L 25/167* (2013.01); *H01L 31/02002* (2013.01); *H01L 31/0216* (2013.01); *H01L 24/03* (2013.01); *H01L 24/27* (2013.01); *H01L 24/83* (2013.01); *H01L 31/0224* (2013.01); *H01L 31/02966* (2013.01); *H01L 31/09* (2013.01); *H01L 2224/03845* (2013.01); *H01L 2224/05017* (2013.01); *H01L 2224/051* (2013.01); *H01L 2224/05564* (2013.01); *H01L 2224/05609* (2013.01); *H01L 2224/0801* (2013.01); *H01L 2224/08145* (2013.01); *H01L 2224/2783* (2013.01); *H01L 2224/29026* (2013.01); *H01L 2224/29034* (2013.01); *H01L 2224/29188* (2013.01); *H01L 2224/32145* (2013.01); *H01L 2224/80815* (2013.01); *H01L 2224/83896* (2013.01); *H01L 2924/3512* (2013.01)

(56) References Cited

U.S. PATENT DOCUMENTS

| | | | |
|---|---|---|---|
| 7,564,057 | B1 | 7/2009 | Yamazaki |
| 8,481,376 | B2 | 7/2013 | Saxler |
| 8,808,513 | B2 | 8/2014 | Laptev |
| 9,412,902 | B2 | 8/2016 | Shatalov |
| 10,515,905 | B1* | 12/2019 | Rondon ............ H01L 21/02164 |
| 11,410,937 | B2 | 8/2022 | Clarke |
| 2003/0013218 | A1 | 1/2003 | Chason |
| 2004/0113238 | A1* | 6/2004 | Hasunuma ........ H01L 21/76832 257/E23.152 |
| 2011/0140242 | A1 | 6/2011 | Ramdani |
| 2011/0233658 | A1* | 9/2011 | Loechelt .......... H01L 29/66696 257/329 |
| 2013/0296158 | A1 | 11/2013 | Cao |
| 2014/0110754 | A1 | 4/2014 | Jain |
| 2019/0385954 | A1 | 12/2019 | Rondon |
| 2021/0249462 | A1 | 8/2021 | Huang |
| 2021/0280531 | A1 | 9/2021 | Clarke |
| 2022/0285298 | A1 | 9/2022 | Clarke |
| 2022/0372651 | A1 | 11/2022 | Clarke |

FOREIGN PATENT DOCUMENTS

WO 2016209282 A1 12/2016
WO 2021178031 A1 9/2021

OTHER PUBLICATIONS

Felmetsger et al., "Stress Control in AlN and Mo Films for Electro-Acoustic Devices", Conference Paper, Jun. 2008 Doi: 10.1109/FREQ.2008.4623076 Source: IEEE Xplore.

Lang et al.; "Stress compensation techniques in thin layers applied to silicon micromachining"; MRS Online Proceedings Library Archive 284; 1992; Abstract only.

Mackenzie et al.; "Stress control of Si-based PECVD dielectrics"; Proceedings of the 207th Electrochemical Society Meeting; 2005.

Panda et al.; "Reduction of residual stress in AlN thin films synthesized by magnetron sputtering technique." Materials Chemistry and Physics 200 (2017): 78-84.

R. Singh, A.K. Gupta and K.C. Chhabra, "Surface Passivation of Mercury-Cadmium-Telluride Infrared Detectors", Def. Sci. J., vol. 41, No. 3, Jul. 1991, pp. 205-239.

S.K. Jha et al., "Bake stability of CdTe and ZnS on HgCdTe: An x-ray photoelectron spectroscopy study", J. Elect. Mat. Aug. 2003, vol. 32(8), pp. 899-905.

Venkataraj et al., "Structural, optical and mechanical properties of aluminium nitride films prepared by reactive DC magnetron sputtering", Thin solid Films, 502, (2006), pp. 235-239.

Zhang, J., "A Fundamental Study of Interface Effects in HgCdTe Materials and Devices", Thesis presented for the degree of Doctor of Philosophy, The University of Western Australia, 2015.

Ryu, et al., "Stress-Induced Delamination of Through Silicon Via Structures", AIP Conf. Proc. 1378, 153 (2011).

Zhao, et al., "Effect of Thermal Mechanical Behaviors of Cu on Stress Distribution in Cu-Filled Through-Silicon Vias Under Heat Treatment", J. Elect. Mat. 47, 142-147 (2018).

Reed et al., "Tensile Strength and Ductility of Indium", (NIST), Mat. Sci. and Eng. A, 102 (1988) 227-236.

Cheng, et al., "Mechanical Response of Indium Micro-joints to Low Temperature Cycling", 2009 Electronic Components and Technology Conference, p. 1792-1795.

Zhang et al., "Characterization of nanoscale chips and a novel model for face nanogrinding on soft-brittle HgCdTe films", Tribol. Lett. 49, 203-215 (2013).

* cited by examiner

Fig. 1
(Conventional)

Fig. 2
(Conventional)

Fig. 3
(Conventional)

Fig. 4
(Conventional)

HYBRID POCKET POST AND TAILORED VIA DIELECTRIC FOR 3D-INTEGRATED ELECTRICAL DEVICE

TECHNICAL FIELD

The present disclosure relates generally to electrical devices having electrical interconnect structures, and more particularly to an electrical device with a tailored via dielectric and/or hybrid pocket post interconnect structure, particularly for three-dimensionally integrated electrical devices, such as planar infrared (IR) detectors that operate at low temperatures.

BACKGROUND

Electrical devices, such as semiconductor integrated circuits (ICs) or other semiconductor devices, are typically fabricated into and/or on a substrate, such as a silicon wafer, resulting in an IC area that generally increases in size and density as the complexity of the IC increases. One trend in recent IC fabrication has been to increase the number and/or different types of ICs by vertically stacking and vertically interconnecting the ICs together. Generally, each of the vertically stacked ICs can be of different sizes, come from different size wafers, have different functions, be made of different materials, etc.

Some conventional methods for realizing the approach of vertically stacking and integrating ICs is through a direct bond or hybrid bond process. Commonly, after a desired number of individual ICs have been vertically stacked, the stacked electrical device assembly undergoes a temperature treatment to cause diffusion between structure(s) of the opposing ICs resulting in a 3D-integrated electrical device structure with an electrical connection across and between the stacked ICs.

SUMMARY

Some vertically integrated electrical devices of the type described above are intended to operate in a temperature regime that is far from standard ambient temperature (i.e., 25° C. according to IUPAC standards). For example, some types of infrared detectors may operate at a temperature of about −200° C. This has been found to cause structural damage and interrupted electrical communication between interconnect structures in the electrical device due to tensile strain generated by mismatches in the coefficients of thermal expansion (CTEs) between different materials in the device. For instance, some device structures may incorporate fragile materials into their architecture, such as semiconductor materials with low fracture toughness, in which CTE-induced tensile forces will cause damage and/or interrupt proper operation of the material. In addition, some materials exhibit piezoelectric behavior under strain, which can negatively impact device operability by generating unwanted electrical voltages and currents.

An aspect according to the present disclosure provides a vertical interconnect design that reduces or eliminates damage and/or electrical interruption due to tensile strain from thermal expansion and contraction during fabrication or operation of the electrical device, particularly for 3D-integrated devices formed by wafer bonding techniques.

According to an aspect, the electrical device provides such a design by tailoring the coefficients of thermal expansion (CTE) in the dielectric insulating layer(s) relative to other structures in the device. For example, the dielectric insulating layer(s) are tailored to provide a coefficient of thermal expansion that is equal to or greater than a coefficient of thermal expansion of the interconnect structure extending through the dielectric layer(s). To facilitate such a tailored design, the CTE of one or more dielectric insulating layer(s) may be greater than that of the dielectric bonding layer itself that is disposed between individual stacked electrical devices.

Alternatively or additionally, according to an aspect, the electrical device provides such a design by building a hybrid interconnect structure including a low-CTE conductor post with a pocket containing a high-CTE conductor. In particular applications, the 3D-integrated electrical device may include a photodetector bonded to a read out integrated circuit (ROIC). The photodetector may be an IR sensor, for example, in which mercury cadmium telluride ($Hg_{1-x}Cd_xTe$) (also referred to as "MCT") is employed as the photoconductive material. MCT is an example of a fragile material that is susceptible to damage (e.g., defects, crack propagation, and/or interface failure) and/or electrical interruption (e.g., piezoelectric response) when experiencing a relatively small amount of tensile strain. For example, the $K_{IC}$ fracture toughness of MCT may be about 0.20 MPa·M$^{1/2}$ by microindentation testing.

The bonding of electrical connections between wafers containing MCT and wafers containing ROICs generally involves a robust conductive interconnect structure passing through the dielectric insulating layers, which may be about 4 μm thick in total for an individual electrical device. However, conventional methods used to form interconnects in such 3D-integrated detectors have been found to falter or fail when cooled to below ambient room temperature, and more particularly when cooled to a very low operating temperature of the device of 76K (−197° C.). This is believed to be due to CTE mismatches in the conventional design, in which the conventional metal interconnect post contracts more than the surrounding dielectric layer, imparting high tensile stress on the contact pads and the MCT layer.

According to an aspect of the present disclosure, to enable a successful electrical structure during fabrication and operation, it is desirable to construct the electrical interconnect in a way that minimizes tensile strain on the fragile MCT material across a temperature range that includes fabrication and operation, about 70K to 433K, for example.

More particularly, according to an aspect, an interconnect structure is described herein that overcomes at least the foregoing problem with conventional designs by providing an electrical device that assures good electrical contact between a ROIC and an MCT-based detector through layers of rigid dielectrics and bonding oxides, without causing tensile strain between the fragile MCT semiconductor contacts and their contact metal interface.

According to an aspect, an electrical device includes: a substrate; an insulating layer supported by the substrate, wherein the insulating layer has at least one via hole; and an electrically conductive vertical interconnect disposed in the via hole; wherein the vertical interconnect has a coefficient of thermal expansion that is equal to or less than a coefficient of thermal expansion of the insulating layer.

According to an aspect, a 3D-integrated electrical device includes a first electrical device bonded and electrically integrated to a second electrical device, the 3D-integrated electrical device comprising a hybrid vertical interconnect including: a post made with a first electrically conductive material, a contact disposed within a pocket of the post, the contact being made with a second electrically conductive material, wherein the first electrically conductive material has a coefficient of thermal expansion that is different than a coefficient of thermal expansion of the second electrically conductive material.

According to an aspect, a method of making a semiconductor device, includes: providing a substrate; forming an insulating layer overlying at least a portion of the substrate; forming a via hole in the insulating layer; and forming an electrically conductive vertical interconnect in the via hole; wherein the electrically conductive vertical interconnect has a coefficient of thermal expansion that is equal to or less than a coefficient of thermal expansion of the insulating layer.

The following description and the annexed drawings set forth certain illustrative embodiments of the invention. These embodiments are indicative, however, of but a few of the various ways in which the principles of the invention may be employed. Other objects, advantages and novel features according to aspects of the invention will become apparent from the following detailed description when considered in conjunction with the drawings.

BRIEF DESCRIPTION OF THE DRAWINGS

The annexed drawings, which are not necessarily to scale, show various aspects according to the present disclosure.

DETAILED DESCRIPTION

The principles and aspects according to the present disclosure have particular application to electrical devices, such as integrated circuit (IC) devices, and more particularly vertically integrated semiconductor integrated circuit (IC) devices, including application specific integrated circuits (ASICs), focal plane arrays and intelligent image sensors, memory chips, monolithic microwave integrated circuits (MMICs), infrared electrical devices (e.g., infrared detectors), antenna circuits, stripline, distribution networks, etc., and will be described below chiefly in this context. It is understood, however, that the principles and aspects according to the present disclosure may be applicable to other electrical devices, or electrical circuits in general, where it is desirable to provide an aluminum nitride tensile layer for balancing forces and thereby controlling the amount of bow in such devices. Non-limiting examples of such electrical devices may include non-semiconductor devices, such as passive radio frequency (RF) circuits (for example, filters or antenna arrays), or other semiconductor devices, such as diodes, photocells, transistors, sensors, and the like. The exemplary method of forming the exemplary electrical device may also be applicable to vertically integrating both active and passive electrical devices.

Referring to FIGS. 1-4, a schematic illustration of a conventional 3D-integrated device 10 including a read out integrated circuit (ROIC) 12 and photodetector 14 are shown. In the illustration, the ROIC 12 includes a metal vertical interconnect 16 in a via hole extending through a bonding layer 18 that is supported by a substrate 20. Also shown in the illustration, the conventional photodetector 14 includes at a corresponding metal vertical interconnect 22 extending through a via hole extending through a bonding layer 24 that is supported by a substrate 26. The substrate 26 of the photodetector 14 may include mercury cadmium telluride ($Hg_{1-x}Cd_xTe$) (also referred to as "MCT") as the photoconductive material of the sensor. A metal contact pad 27 overlies the MCT layer (also referred to with reference numeral 26 in this illustration) for providing an electrical connection between the MCT material and metal interconnect 22.

Figure 1:
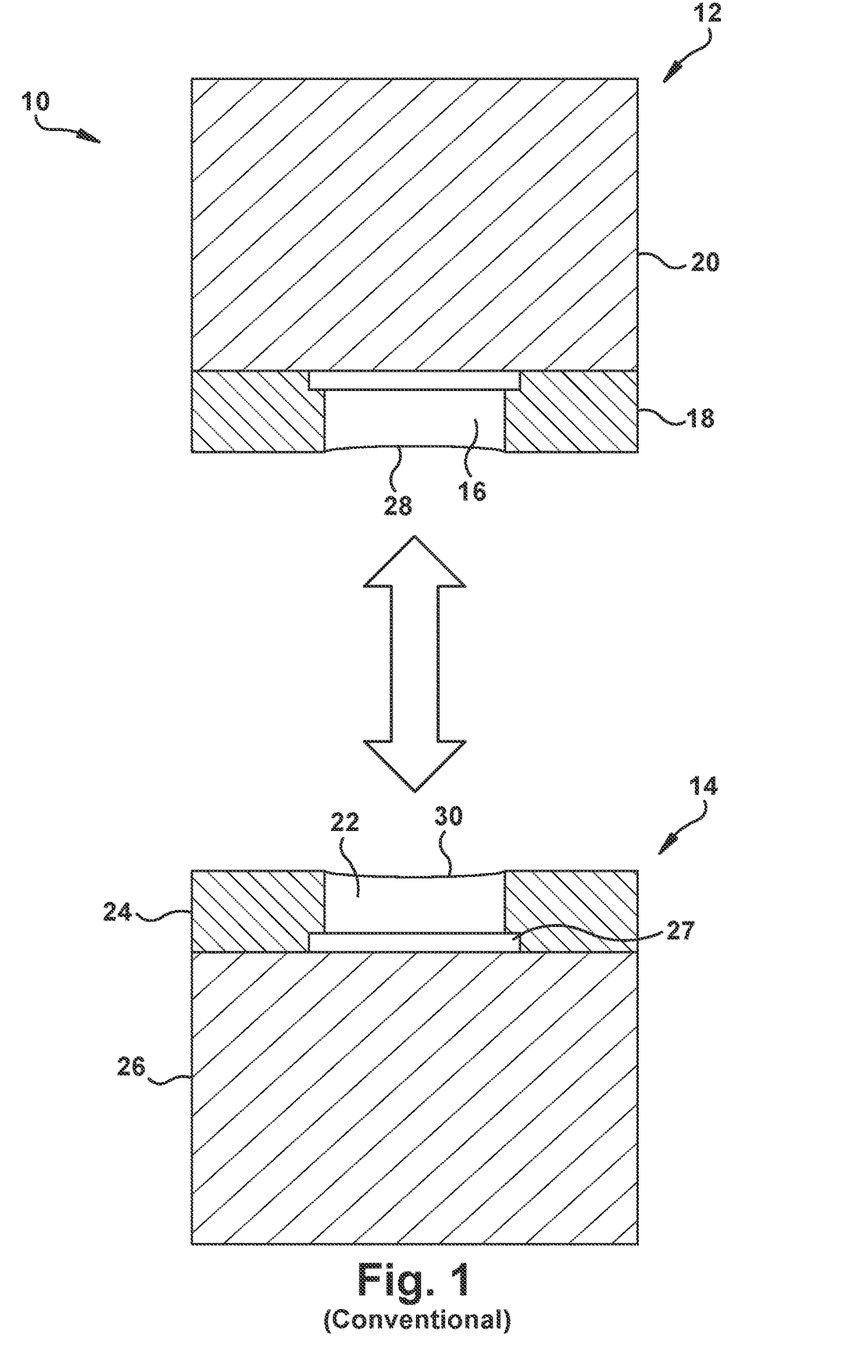
FIG. 1 is a schematic illustration of first and second conventional electrical devices prepared for 3D-integration.
Figure 2:
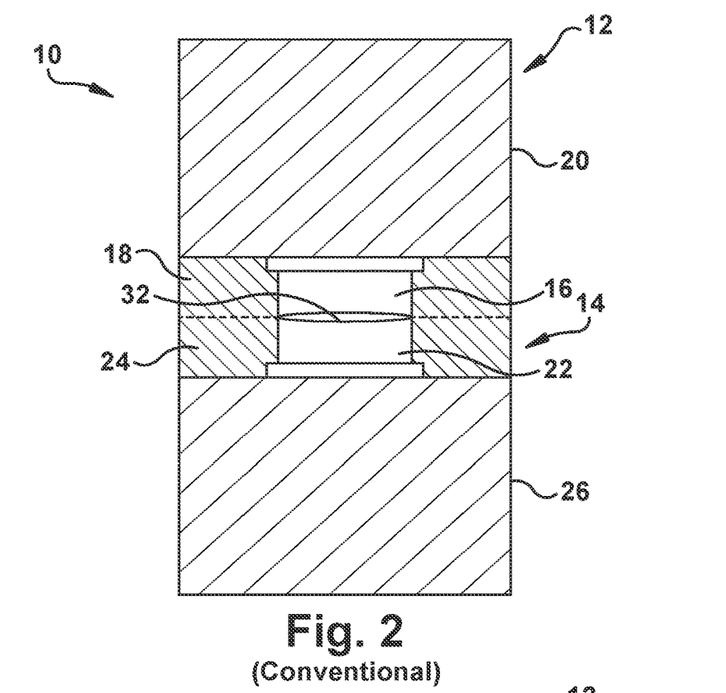
FIG. 2 is a schematic illustration of a state of initial contact between the first and second conventional electrical devices in FIG. 1 at standard ambient temperature.

As shown in FIG. 1, the interconnect 16 of the ROIC 12 and the interconnect 22 of the photodetector 14 may each have a respective dished profile 28, 30 by virtue of chemical mechanical polishing (CMP) during processing of each device 12, 14. FIG. 2 shows the photodetector 14 and ROIC 12 being contacted and bonded together at the respective interfaces of the bonding layers 18, 24. As shown, because of the dished profiles 28, 30, a gap 32 exists between the interfaces of the respective interconnects 16, 22.

Figure 3:
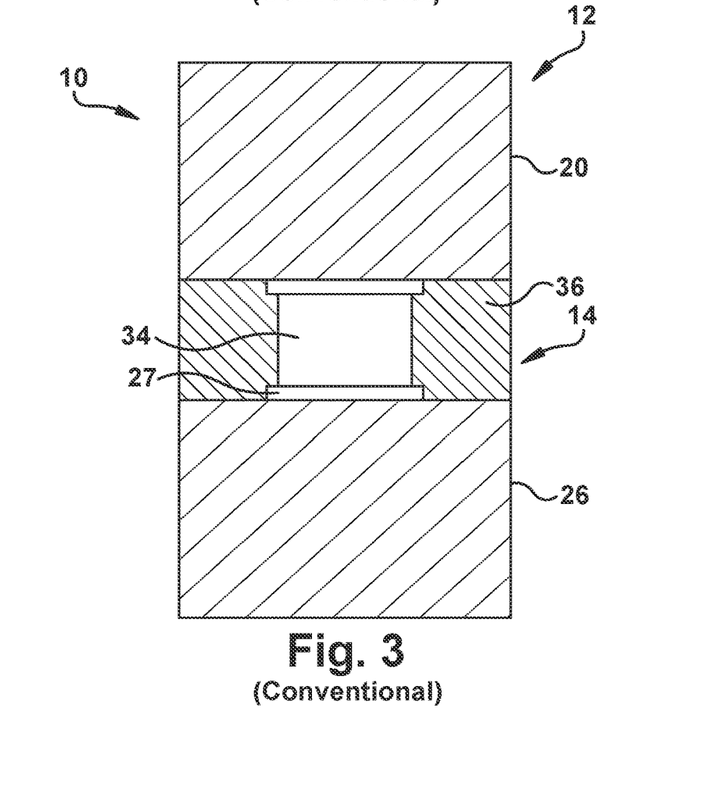
FIG. 3 is a schematic illustration of a state of elevated temperature bonding and 3D-integration between the first and second conventional electrical devices in FIG. 1.

FIG. 3 illustrates a state of annealing the electrical device assembly at an elevated temperature. As shown, during the elevated temperature anneal, the metal interconnects 16, 22 expand more than their surrounding bonding layers 18, 24, closing the gap 32 therebetween and making compressive contact in which the interconnects 16, 22 undergo diffusion across their interface and fuse together into a single integrated conductive post 34 extending through an integrated bonding layer 36.

Figure 4:
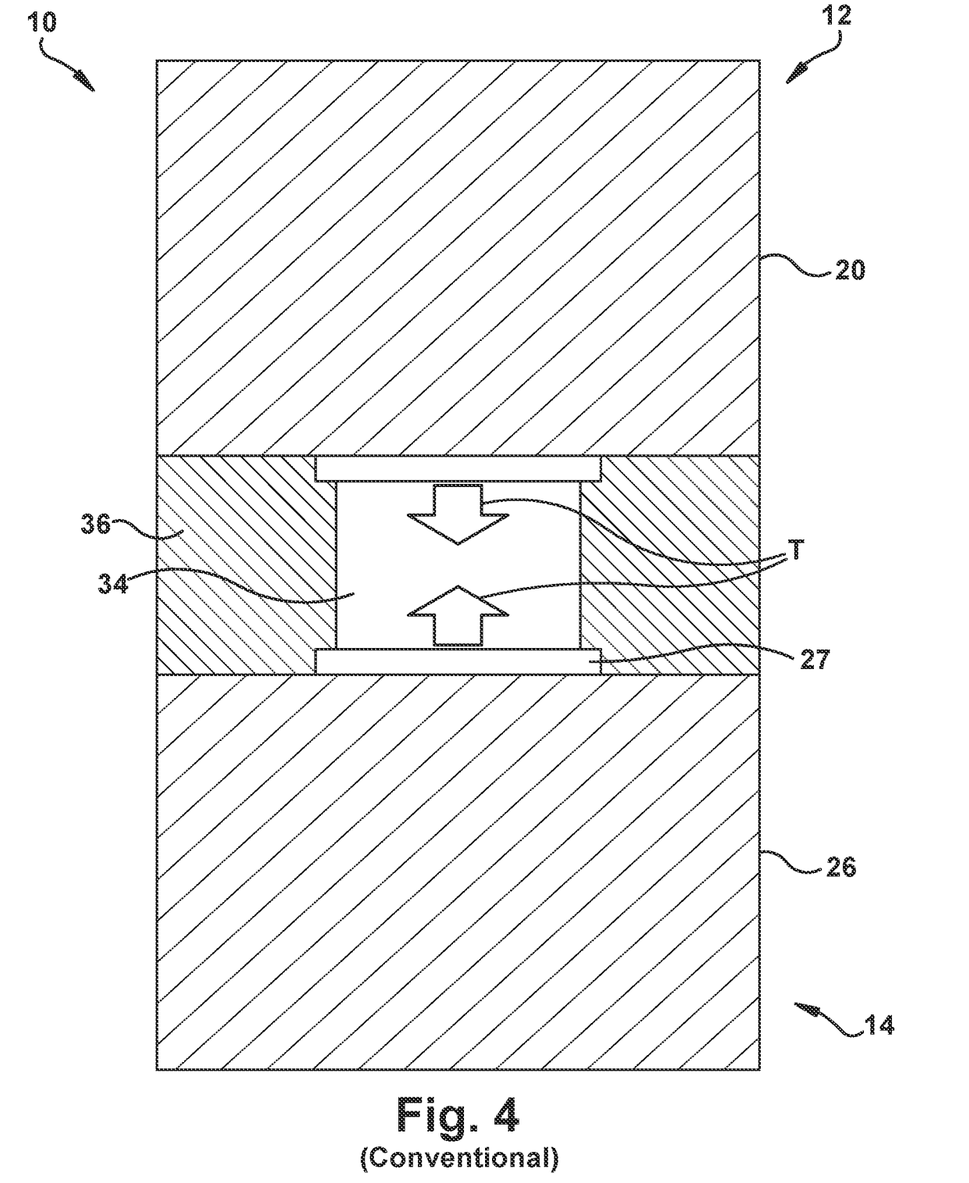
FIG. 4 is a schematic illustration of the 3D-integrated device in FIG. 3 when cooled to standard ambient temperature, or lower, following the elevated temperature bonding.

FIG. 4 illustrates the effect of cooling to standard ambient temperature, or below, following the elevated temperature anneal shown in FIG. 3. As shown in FIG. 4, the integrated metal interconnect structure 34 will contract more than its surrounding integrated bonding layer 36, resulting in tensile stress (depicted with arrows T). This tensile stress increases significantly as the temperature is cooled to a very low operating temperature of the device, which may be around 76K (−197° C.). It has been found that CTE mismatches between the metal interconnect structure(s) 34 and surrounding insulating bonding layer(s) 36 can cause the 3D-integrated device 10 to reduce in performance or fail when cooled to ambient room temperature, and more particularly when cooled to the operating temperature of the device (e.g., 76K). More specifically, the effect of this tensile stress is to generate strain on the semiconductor contact surface. The performance of the electrical device 10 may be negatively impacted by tensile strain, especially when the tensile strains are imparted upon a fragile material, such as MCT. For example, the tensile strains imparted on the MCT material may impact performance by inducing a piezoelectric response. Alternatively or additionally, the tensile strains may cause damage to the MCT material in the form of defects, crack propagation, and/or interface failure with the metal contact pad 27. The effect of these tensile strains may become more pronounced when the difference between the CTE of the interconnect material and surrounding insulating (e.g., bonding layer) is greater. However, even indium, which has a relatively low CTE (e.g., compared to copper), can exert about 2.8 MPa of residual tensile strain when cooled to 76K, which would exceed the fracture toughness of MCT (about 0.20 MPa·M$^{1/2}$ K$_{IC}$).

An exemplary electrical device is described herein that improves upon one or more deficiencies of conventional design(s). In particular, one aspect provides an electrical device including a substrate, an insulating layer supported by the substrate, and an electrically conductive vertical interconnect disposed in a via hole of the insulating layer, in which the insulating layer provides a CTE that is equal to or greater than a CTE of the vertical interconnect to thereby impart neutral or axially compressive forces at opposite ends of the vertical interconnect at lower temperatures. Alternatively or additionally, another aspect provides an electrical device with a hybrid vertical interconnect structure, including a low CTE conductor post having a pocket that contains a high CTE conductor contact, in which, at low operating temperatures, the high CTE conductor contact is under tension due to the higher CTE, thereby enabling the high CTE conductor contact to relieve strain in the device by void expansion and elongation. An aspect also provides method(s) of fabricating such device(s) according to the above.

Figure 9:
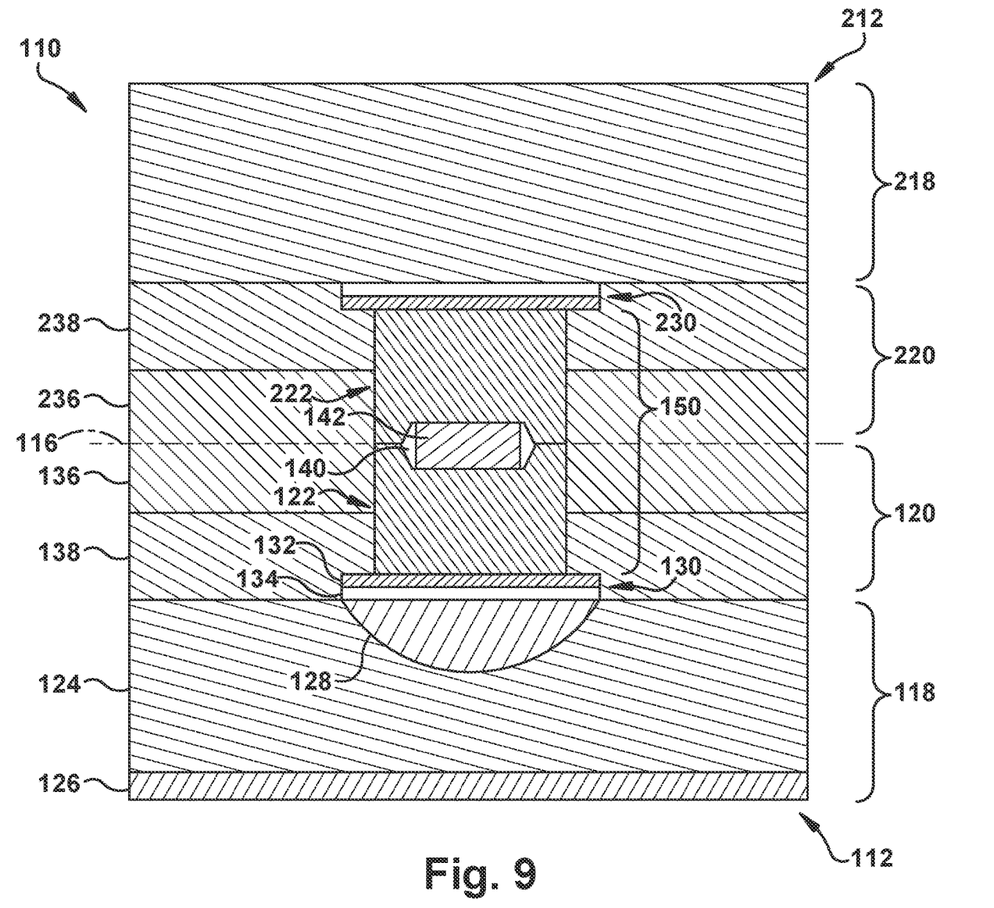
FIG. 9 is a schematic illustration of a state of low temperature operation of the exemplary 3D-integrated device in FIG. 8.

Turning initially to FIG. 9, an exemplary 3D-integrated electrical device 110 according to an embodiment of the present disclosure is shown in a low-temperature operating state of the device, such as about 76K. As shown, the exemplary 3D-integrated device 110 includes an exemplary first electrical device 112 bonded and electrically integrated to an exemplary second electrical device 212. The delineation between the first and second electrical devices is shown with broken line 116; although it is understood that following bonding and 3D-integration (described below), the two electrical devices 112, 212 form the single 3D-integrated electrical device 110.

The first electrical device 110 includes a substrate 118, an electrically insulating layer 120 supported by the substrate 118, and at least one electrically conductive interconnect 122 in a via hole extending through the insulating layer 120. In exemplary embodiments, the first electrical device 112 is a semiconductor device in the form of a photodetector (also referred to with 112). In the illustrated embodiment, the photodetector 112 is an IR detector. The first electrical device 112 may represent one pixel of a photodetector array. The second electrical device 212 in the illustrated embodiment is a read out integrated circuit (ROIC), which may include many of the same or similar structures as the photodetector 112, as described in further detail below.

The substrate 118 supporting the insulating layer 120 and interconnect 122 includes a layer of photoconductor material 124, which may at least partially overlie and be supported by a lower substrate layer 126. In exemplary embodiments, the photoconductor material 124 is mercury cadmium telluride (Hg$_{1-x}$Cd$_x$Te) (also referred to as "MCT"), which forms a photoconductive layer (also 124) overlying the lower substrate layer 126. The lower substrate layer 126 may be any suitable substrate configured to support the other layers, such as a silicon substrate, for example. In the photodetector 112, an incident IR photon may pass through the lower substrate layer 126 and interact with the MCT photoconductive material 124 to generate a photoelectric current. To provide a photoelectric effect, the photoconductive layer 124 may include an implant 128 oppositely doped to that of the photoconductive material 124. For example, the MCT photoconductive material 124 may be an n-type semiconductor, and the implant 128 may be a p-type implant doped with arsenic.

The layers below the insulating layer 120, which in combination are generally referred to herein simply as the substrate 118, may include additional layers (not shown) depending on the type of electrical device and fabrication method. For example, between the MCT photoconductive layer 124 and silicon substrate layer 126, one or more buffer layers may be provided which may include cadmium and tellurium, and which may improve interfacial bonding of the MCT photoconductive layer 124 above. In addition, one or more passivation layers may be formed atop the photoconductive layer 124, which may include cadmium and tellurium, and which may improve the interfacial bonding between the MCT photoconductive layer 124 and adjacent insulating layer 120.

Between the MCT photoconductive layer 124 and the interconnect 122 is an electrical contact pad 130 that transfers electricity generated in the MCT photoconductive layer 124 to the interconnect 122. Generally, the electrical contact pad 130 is disposed above the implant 128 in the MCT photoconductive layer 124 to transfer the electrons generated at the p-n junction (or other junction types imbedded within the photodiode) due to the photoelectric effect. The contact pad 130 may be formed with any suitable electrically conductive material, including an electrically conductive metal. In exemplary embodiments, the contact pad 130 may include a metal layer 132 (e.g., gold) and a barrier layer 134 (e.g., TiN) to enhance rigidity and/or prevent interdiffusion.

The insulating layer 120 overlies the MCT photoconductive layer 124 and includes the via hole through which the interconnect 122 extends. The insulating layer 120 is electrically insulative and also may be referred to as a dielectric layer (also 120). In exemplary embodiments, the insulating layer 120 is a multi-layered structure including an upper bonding layer 136 and an underlying dielectric layer 138. As shown, the via hole extends through both layers 136, 138 such that respective portions of the interconnect 122 are surrounded by each of the upper bonding layer 136 and underlying dielectric layer 138.

As indicated above, the MCT material of the photoconductive layer 124 is a fragile material, having a low fracture toughness of about 0.20 MPa·m$^{1/2}$K$_{IC}$. Accordingly, to mitigate detrimental effect to the MCT material during fabrication or operation at high or low temperatures, at least the first electrical device 112 containing the fragile material (e.g., MCT) tailors the CTE of the dielectric insulating layer 120 relative to the CTE of the interconnect structure 122. Generally, the fragile material of the underlying photoconductive layer 124, such as MCT, may have greater strength in compression than in tension. Accordingly, in the illustrated embodiment, the overall CTE of the combined insulating layer 120 (including the combined CTEs of the upper bonding layer 136 and underlying dielectric layer 138, and other layers, if any) is configured to be about equal to or greater than the overall CTE of the interconnect 122 extending through the insulating layer 120. As such, when the exemplary 3D-integrated device 110 is used at low temperatures (e.g., 60K-90K), for example, the differences in CTE between the insulating layer 120 and interconnect 122 places the MCT photoconductive layer 124 in a neutral state, or in compression, instead of in tension. It is understood that the CTE and thickness of the underlying dielectric layer 138 relative to the bonding layer 136 and interconnect 122, and the overall CTE and thickness of the combined insulating layer 120 relative to the interconnect 122, may be selected to achieve the desired forces exerted upon the fragile material (e.g., MCT) in the photoconductive layer 124. In the illustrated embodiment, for example, the overall thickness of the insulating layer 120 on the first electrical device side is in a range from about 0.5 µm to about 4 µm thick, in which after 3D-integration the sum of bonding layer thickness is in the range from about 1 µm to about 8 µm thick.

In exemplary embodiments, the bonding layer 136 may be a conformal dielectric film. The bonding layer 136 provides bonding with an opposing bonding layer 236 of the second electrical device 212. The bonding may include ambient room temperature bonding by Van der Waals forces between the bonding layers 136, 236, and which may be further promoted by formation of covalent bonds over time or at elevated temperatures. The bonding layer 136 may be a non-metallic material, such as an oxide, more particularly a silicon oxide ($SiO_x$), for example silicon dioxide (e.g., fused silica or $SiO_2$). By way of example, and not limitation, the bonding layer may have a CTE in a range from about $0.5 \times 10^{-6}$/K to about $3.0 \times 10^{-6}$/K, such as about $1.5 \times 10^{-6}$/K for $SiO_x$. The bonding layer 136 may be formed by any suitable technique, such as a deposition process, including physical vapor deposition, reactive physical vapor deposition, chemical vapor deposition, plasma enhanced chemical vapor deposition, sputtering, or a spin-on glass process.

In exemplary embodiments, the underlying dielectric layer 138 may have a greater CTE than the bonding layer 136 to increase the overall CTE of the combined insulating layer 120 relative to the interconnect 122. The underlying dielectric layer 138 should provide good adhesion and compatibility with the MCT photoconductive layer 124 below and the bonding layer 136 above. Suitable buffers layers may be provided to facilitate adhesion. The underlying dielectric layer 138 may be formed by any suitable process such as those for the bonding layer 136 noted above. In exemplary embodiments, the underlying dielectric layer 138 is an oxide or nitride having a CTE in a range from about $1.0 \times 10^{-6}$/K to about $9.0 \times 10^{-6}$/K. In the illustrated embodiment, for example, the underlying dielectric layer 138 is aluminum nitride (AlN), having a CTE of about $4.6 \times 10^{-6}$/K to about $5.5 \times 10^{-6}$/K. Depending on the bonding layer and underlying dielectric layer selected, and the relative thicknesses used, the combined insulating layer 120 may have an overall CTE in a range from about $1.0 \times 10^{-6}$/K to about—$8.5 \times 10^{-6}$/K. For example, an insulating layer including AlN and $SiO_x$ of equal thickness may have an overall CTE from about $3.0 \times 10^{-6}$/K to about $3.5 \times 10^{-6}$/K. Alternatively or additionally, a layer of aluminum oxide ($Al_2O_3$) may be employed above or below the AlN layer, or by itself. The aluminum oxide layer may have a CTE of about $8 \times 10^{-6}$/K. In order to create a more homogeneous average CTE within the tailored insulating layer, the various underlying dielectrics and bonding layers may be deposited as many thin layers, alternating in composition. The only constraint is that the layer contacting the MCT be suitably selected for good adhesion, and that the final layer of bonding layer be thick enough to undergo polishing without loss of bonding performance.

The interconnect 122 is made of an electrically conductive material that conducts electricity from the contact pad 130 to an opposing interconnect 222 of the second electronic device 214 (e.g., ROIC in the illustrated embodiment). As discussed above, in exemplary embodiments the CTE of the interconnect 122 is about equal to or less than the overall CTE of its surrounding insulating layer 120, which thereby may impart compressive forces against the contact pad 130 and underlying MCT photoconductive layer 124 instead of tensile forces. The CTE of the interconnect 122 may therefore be in a range of from about $1.0 \times 10^{-6}$/K to about $8.5 \times 10^{-6}$/K. The interconnect 122 may be made of any suitable material that is processable in the fabrication of the electrical device 114 (e.g., fillable into a via hole, for example, and which does require high processing temperatures that would destroy the integrity of materials in the device, such as the temperature-sensitive MCT, for example).

In exemplary embodiments, the interconnect 122 is made of electrically conductive polysilicon, such as a boron-doped polysilicon material. The doped polysilicon may be deposited by a suitable technique, such as PVD (sputtering). The resistivity of the polysilicon material may be about 10E-2 Ω·cm, neglecting contact resistance. A 4×4 µm polysilicon interconnect 122 (also referred to as a post 122) has a theoretical resistivity of about 3.2 mΩ. The CTE of the polysilicon material may be about $2.6 \times 10^{-6}$/K.

The second electrical device 212, which is an ROIC in the illustrated embodiment, may have many of the same or similar features as the first electrical device 112, including a substrate 218, an electrically insulating layer 220 supported by the substrate 218, and at least one electrically conductive interconnect 222 in a via hole extending through the insulating layer 220. The substrate 218 may include the ROIC circuitry and a contact pad 230 or trace layer for receiving electrons from the photodetector 112 via the interconnect structure. The insulating layer 220 may include a dielectric bonding layer 236, such as $SiO_x$, for bonding to the bonding layer 136 of the first electrical device 112. An underlying dielectric layer 238, such as AlN and/or $Al_2O_3$ may be provided to tailor the overall CTE of the insulating layer 220. The interconnect 222 cooperates with the insulating layer 220 such that the CTE of the insulating layer 220 is about equal to or greater than the CTE of the interconnect 222. The interconnect 222 of the second electrical device 212 also may be polysilicon, such as boron-doped polysilicon.

As shown in the illustrated embodiment, the exemplary 3D-integrated device 110 may include an internal pocket 140 formed between the first interconnect 122 and second interconnect 222. The pocket 140 contains an electrically conductive contact 142 that spans the gap formed by the pocket 140 to thereby engage and electrically connect opposing surfaces of the first and second interconnects 122, 222. The electrically conductive contact 142 may be formed by fusion bonding of a material contained within a recess of each of the first and second interconnects 122, 222, as discussed in further detail below. Such fusion bonding between the respective first and second interconnect structures 122, 222 forms an integrated interconnect 150 of the 3D-integrated device 110. In exemplary embodiments, the electrically conductive contact 142 within the pocket 140 (also referred to as the pocket contact 142) is made of a different material than that of the overall integrated interconnect 150. This thus forms a hybrid pocket post (also referred to with 150) according to this embodiment. The material of the pocket contact 142 preferably has a higher CTE than that of the post portions 122, 222 of the integrated interconnect 150. For example, the CTE of the pocket contact 142 may be in a range from about $3.0 \times 10^{-6}$/K to about $50 \times 10^{-6}$/K. In the illustrated embodiment, for example, the material of the pocket contact 142 is made of indium or copper, and the post portions 122, 222 are made of polysilicon as noted above. Indium, for example, has a CTE of about $32 \times 10^{-6}$/K.

Still referring to FIG. 9, an exemplary operation of the 3D-integrated device 110 at an operating temperature of about 60K-90K, such as about 76K will now be described. In the illustration, the polysilicon interconnect (post) portions 122, 222 of the hybrid pocket post 150 contracts slightly less than the surrounding dielectric insulating layers 120, 220 (e.g., 136, 138, 236, 238) due to its lower CTE, and the opposing first and second interconnect (post) portions 122, 222 generate and maintain an axial compressive force at the respective opposite ends as they come into contact during cooling. The pocket contact 142 (e.g., indium) is under tension due to its higher CTE than the polysilicon post portions 122, 222, and thus the pocket contact 142 will relieve strain by void expansion and elongation. This tension is not transmitted to the contact pads 130, 230, since the polysilicon posts 122, 222 are in contact. The amount of compressive force against the contact pads 130, 230 that is generated by the overall hybrid pocket post structure 150 may be in the range of zero to 40 MPa, for example. Current can flow through the polysilicon post portions 122, 222 and the indium contact portion 142 of the hybrid pocket post 150. The high end operating current of a typical MCT photodiode detector device 110 may be about 10E-4 A/cm$^2$, so Joule heating is on the order of 7E-8 K/s per contact—or 2.5E-4 K/hr which is negligible considering heat spreading from the thermally conductive AlN layers and the active cooling of the 3D-integrated device during operation.

The exemplary design of the hybrid pocket post 150 also may limit strain hardening of the pocket contact 142 material (e.g. indium) by encapsulating it within the pocket 140 formed by the post portions 122, 222. For example, it has been found that during thermal cycling, conventional indium post materials exhibit a failure mechanism attributed to strain cycling causing fatigue or strain hardening. It is believed that the actual hardening failure of an indium post is due to its native oxide fracturing caused by CTE mismatch between the indium and its native oxide shell. In the absence of oxygen, such as when encapsulated within the pocket, thermal cycling of the indium pocket contact 142 may lower the Young's modulus, which is the opposite of work hardening or fatigue that is found in conventional designs.

Turning now to FIGS. 5-8, an exemplary method of fabricating the exemplary 3D-integrated device 110 is shown for achieving the exemplary operating state shown in FIG. 9.

Figure 5:
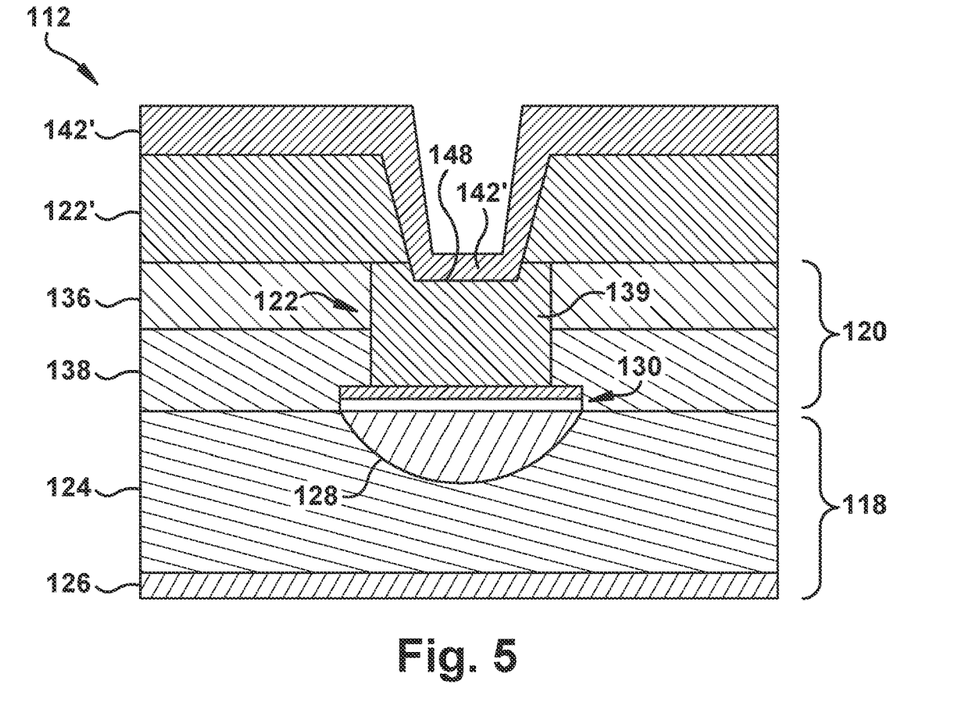
FIG. 5 is a schematic illustration of a first intermediate state of fabricating an exemplary first electrical device according to an embodiment of the present disclosure.
Figure 6:
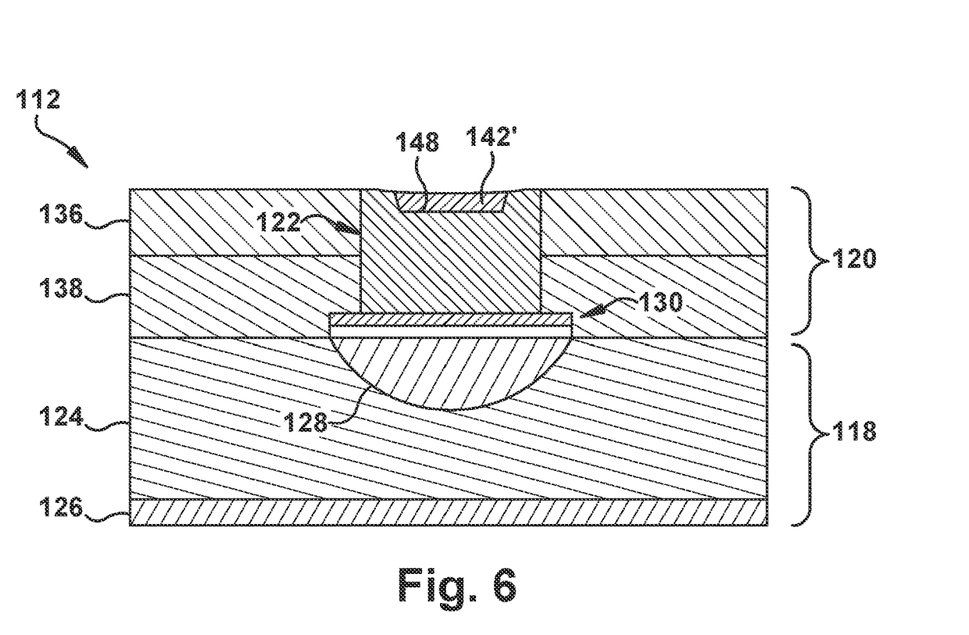
FIG. 6 is a schematic illustration of a subsequent intermediate state of fabricating the first electrical device in FIG. 5.

FIG. 5 shows an intermediate step of forming the first electrical device 112 in which the MCT photoconductive layer 124 has been formed on the silicon substrate layer 126 via molecular beam epitaxy with a doped implant 128 disposed therein. The electrical contact pad 130 has been formed overlying a portion of the MCT photoconductive layer 124 above the implant 128. The AlN dielectric layer 138 has been deposited overlying at least a portion of the MCT photoconductive layer 124 and the contact pad 130, and a SiO$_x$ bonding layer 136 has been deposited over the AlN dielectric layer 138. A via hole 139 is then formed in the SiO$_x$ bonding layer 136 and the AlN dielectric layer 138 to extend to the contact pad 130. Polysilicon is deposited atop the SiO$_x$ bonding layer 136 and into the via hole 139 to form the interconnect 122, in which the deposited polysilicon layer includes overburden material 122'. By virtue of the recess of the via hole 139 relative to the upper surface of the SiO$_x$ bonding layer 136, a recess or cup 148 is formed in the deposited polysilicon layer (referred to with 122' for simplicity). The profile of the cup 148 may be controlled by the deposition ratio of the polysilicon layer 122'—the ratio of arrival to removal as is practiced by using bias-sputtering or alternating deposition and etch steps (sculpting). As shown, the sculpted deposition of the polysilicon material is stopped before the bottom surface of the cup 148 rises above the upper surface of the SiO$_x$ bonding layer 136, which will leave the cup 148 recessed following chemical mechanical polishing (FIG. 6). The depth of the cup 148 may be greater than about 20 nm, for example. After deposition of the polysilicon layer 122', a layer of indium 142' is deposited to overlie the polysilicon layer 12' and also at least partially fill the cup 148. This layer can be deposited selectively using evaporation and lift-off, or by electroplating.

FIG. 6 shows the first electrical device 112 following chemical mechanical polishing (CMP) of the overburden material of the indium layer 142' and polysilicon layer 122' to expose the upper surface of the SiO$_x$ bonding layer 136. Following CMP, the indium contact portion 142 may have about 20 nm average dishing relative to its upper surface. The volume of the formed cup 148 may be about 2.6 $\pi$ cubic microns that is filled with indium portions (also 142') that will fuse to form the contact 142.

Figure 7:
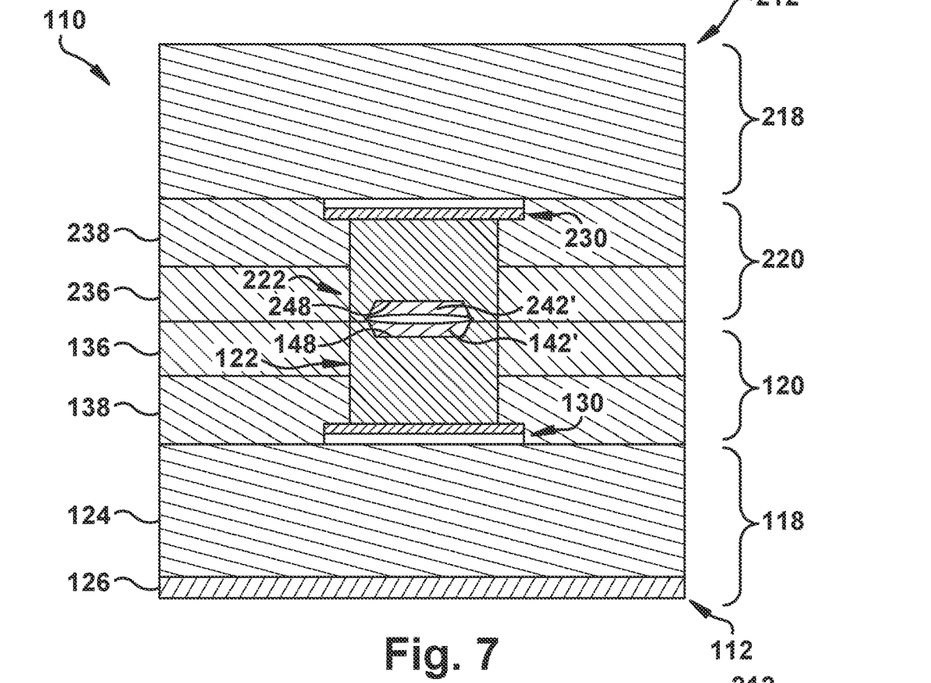
FIG. 7 is a schematic illustration of a state of contact of the first electrical device in FIG. 6 with an exemplary second electrical device according to an embodiment for 3D-integration together.

FIG. 7 shows the start of 3D-integration of the first electrical device 112 (e.g., photodetector) with the second electrical device 212 (e.g., ROIC) at standard ambient temperature (i.e., 25° C. according to IUPAC standard). As noted above, the second electrical device 212 may be fabricated substantially similar to the first electrical device 112, and consequently similar reference numerals are used, but in the 200-series, to refer to the same or similar structures. The initial bond at standard ambient temperature (also referred to as ambient room temperature) includes contacting the exposed interfaces of the SiO$_x$ bonding layers 136, 236 together to form a Van der Waals bond. As shown, the respective indium portions 142', 242' between the first and second electrical devices 112, 212 have a small gap by virtue of the dishing left by CMP.

Figure 8:
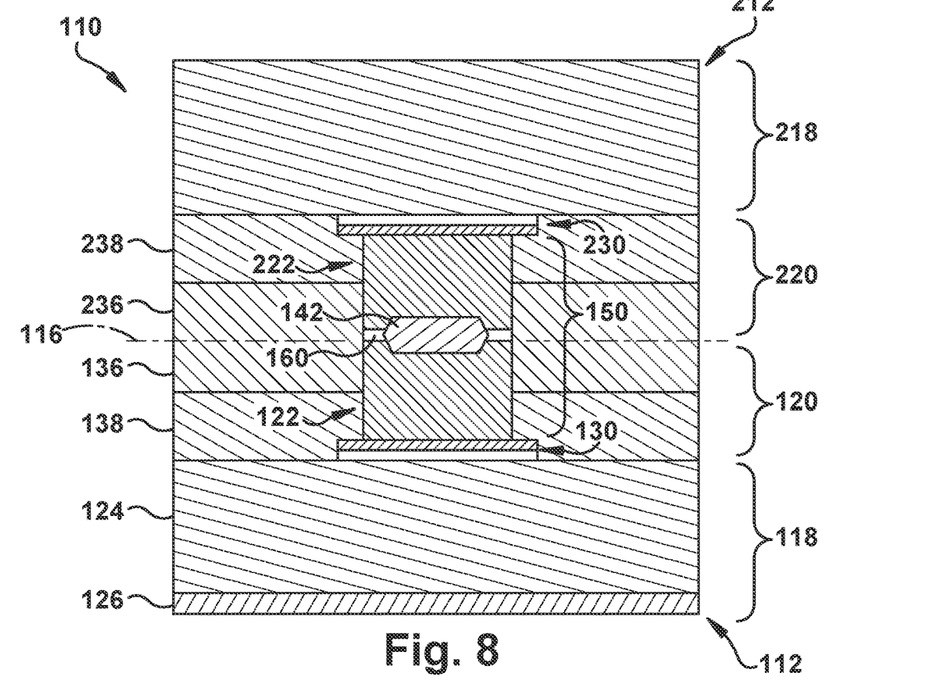
FIG. 8 is a schematic illustration of a state of elevated temperature bonding and 3D-integration between the first and second electrical devices in FIG. 7.

FIG. 8 shows annealing of the 3D-integrated device 110 to covalently bond the SiO$_x$ bonding layers 136, 236 and fusion bond the indium contact portions 142', 242' together to form the integrated hybrid pocket post 150 including the post portions 122, 222 and contact 142 bridging the gap therebetween. In exemplary embodiments, the stack of dielectric layers 120, 220 (e.g., AlN and SiO$_x$) is designed so that the polysilicon post portions 122, 222 have a small gap 160 (e.g., about 200 A) between them at 160° C., which is the temperature of the exemplary elevated temperature anneal. The cup 148, 248 in each polysilicon interconnect 122, 222 is designed to hold enough indium contact material so that it will expand across the gap and weld to its mate at 160° C. The 160° C. anneal will cause the upper surface of each indium contact portion 142', 242' to bulge slightly (about 450 A) beyond the upper surfaces of the respective polysilicon post portions 122, 222 to enable contact and suitable fusion bonding of the indium portions 142', 242' in each cup 148, 248. The bridging connection by the indium contact 142 makes the 3D-integrated device 110 electrically testable at ambient room temperature. The tolerance for the cup 148, 238 profile and volume of indium contact portion 142', 242' may be relatively high (±30%) due to the gap 160 provided between the polysilicon interconnect portions 122, 222, allowing the indium contact portions 142'2, 242' to expand without breaking the bond of the bonding layers 136, 236. This makes the structure highly manufacturable. Again as shown in FIG. 9, at a low operating temperature, the polysilicon post portions 122, 222 come into contact, preserving axial compressive strain to prevent damage at the interface of the delicate MCT material 124 and contact pad 130, and generating a second current path. This makes the structure more reliable.

While an exemplary form of the exemplary electrical device 112 and/or 3D-integrated electrical device 110 have been described above, alternative configurations also could be employed according to the principles and aspects described herein. For example, although reference is made predominantly to MCT as the fragile material, it is understood that other fragile materials may be used at other regions in electrical devices, in which it may be desirable to provide the desired forces by tailoring the structures of the device as described herein. Generally, a fragile material is one having a $K_{IC}$ fracture toughness of less than 1 MPa·M$^{1/2}$, more particularly 0.5 MPa·m$^{1/2}$. Moreover, although the illustrated embodiment shows and describes the electrical device 112 and 3D-integrated device 110 having both the hybrid pocket post 150 and tailored dielectric layers 120 and/or 220 to provide the desired forces, it is understood that some exemplary embodiments may have only one or the other of these aspects as described herein.

In addition, the pocket post can also be made from a conductive oxide such as ReO$_3$, which has a low CTE and high conductivity. The contact can be made not only from indium, but also copper, nickel, aluminum, Cu$_3$Sn, or any other metallic conductor with the ability to be fusion bonded at around 423K (150 C).

Generally, an exemplary electrical device has been described herein including a substrate, an insulating layer supported by the substrate, and an electrically conductive vertical interconnect disposed in a via hole of the insulating layer. In some embodiments, the insulating layer may be configured to provide a coefficient of thermal expansion (CTE) that is equal to or greater than a CTE of the vertical interconnect to thereby impart axial compressive forces at opposite ends of the interconnect. Alternatively or additionally, in some embodiments, the vertical interconnect may be a hybrid interconnect structure including a low CTE conductor post having a pocket that contains a high CTE conductor contact. At low operating temperatures, the high CTE conductor contact is under tension due to the higher CTE, and thus the high CTE conductor contact relieves strain in the device by void expansion and elongation. This strain is exerted on the low CTE pocket post, and is not transferred to the underlying MCT surface since the posts are in contact and unable move any closer to one another.

According to an aspect, the hybrid vertical interconnect structure is a polysilicon/indium pocket post, which is an innovative two-part structure that takes advantage of the thermal expansion properties of both materials to buffer and mitigate axial tensile strain at the end points, particularly at an interface of a fragile material, such as at an MCT contact pad.

According to another aspect, the electrical device uses tailored thickness ratios of aluminum nitride and/or aluminum oxide to take advantage of their various CTE values while supporting the bonding layer of SiO$_x$. These layers are further tailored for intrinsic stress, so that minimum strain results at the MCT interface and the inherent compressive stress of the bonding SiOx layer can be balanced for neutral wafer bow.

According to another aspect, a conductive doped polysilicon post is deposited at low temperature by PVD to partially fill a via in the insulating layer leaving a cup recess that is filled with indium by electroplating or evaporation. This can be done on both the ROIC and MCT photodetector wafers to form a mating pair that will undergo fusion bond during a brief post-bond anneal to 160° C., without degradation to the thermally-sensitive MCT component. The vias filled by these hybrid pocket posts are formed in dielectric layers comprising bonding oxide SiO$_x$ and (i) AlN and/or (ii) Al$_2$O$_3$ layers to tailor the total thermal expansion and contraction of the via walls. At operating temperatures below ambient, the polysilicon posts make compressive contact and support the contracted and stretched indium connection and absorb its tensile strain so that over the complete temperature range from fusion bond to operation the delicate MCT contact sees little to no tensile strain and only mild compressive strain.

It is understood that all ranges and ratio limits disclosed in the specification and claims may be combined in any manner. The term "about" as used herein refers to any value which lies within the range defined by a variation of up to ±10% of the stated value, for example, ±10%, ±9%, ±8%, ±7%, ±6%, ±5%, ±4%, ±3%, ±2%, ±1%, ±0.01%, or ±0.0% of the stated value, as well as values intervening such stated values.

The term "essentially of" as used herein in connection with a composition or material, such as consisting essentially of, or the like, is understood to mean that minor constituent components and/or impurities may be included which do not affect the fundamental function of the composition or material.

It is to be understood that unless specifically stated otherwise, references to "a," "an," and/or "the" may include one or more than one, and that reference to an item in the singular may also include the item in the plural. The phrase "and/or" should be understood to mean "either or both" of the elements so conjoined, i.e., elements that are conjunctively present in some cases and disjunctively present in other cases. Other elements may optionally be present other than the elements specifically identified by the "and/or" clause, whether related or unrelated to those elements specifically identified unless clearly indicated to the contrary. Thus, as a non-limiting example, a reference to "A and/or B," when used in conjunction with open-ended language such as "comprising" can refer, in one embodiment, to A without B (optionally including elements other than B); in another embodiment, to B without A (optionally including elements other than A); in yet another embodiment, to both A and B (optionally including other elements); etc.

The word "or" should be understood to have the same meaning as "and/or" as defined above. For example, when separating items in a list, "or" or "and/or" shall be interpreted as being inclusive, i.e., the inclusion of at least one, but also including more than one, of a number or list of elements, and, optionally, additional unlisted items. Only terms clearly indicated to the contrary, such as "only one of" or "exactly one of," may refer to the inclusion of exactly one element of a number or list of elements. In general, the term "or" as used herein shall only be interpreted as indicating exclusive alternatives (i.e. "one or the other but not both") when preceded by terms of exclusivity, such as "either," "one of," "only one of," or "exactly one of."

The transitional words or phrases, such as "comprising," "including," "carrying," "having," "containing," "involving," "holding," "made of/with," and the like, are to be understood to be open-ended, i.e., to mean including but not limited to, unless otherwise stated.

Although the invention has been shown and described with respect to a certain embodiment or embodiments, it is obvious that equivalent alterations and modifications will occur to others skilled in the art upon the reading and understanding of this specification and the annexed drawings. In particular regard to the various functions performed by the above described elements (components, assemblies, devices, compositions, etc.), the terms (including a reference to a "means") used to describe such elements are intended to correspond, unless otherwise indicated, to any element which performs the specified function of the described element (i.e., that is functionally equivalent), even though not structurally equivalent to the disclosed structure which performs the function in the herein illustrated exemplary embodiment or embodiments of the invention. In addition, while a particular feature of the invention may have been described above with respect to only one or more of several illustrated embodiments, such feature may be combined with one or more other features of the other embodiments, as may be desired and advantageous for any given or particular application.

What is claimed is:

1. An electrical device comprising:
a substrate;
an insulating layer supported by the substrate, wherein the insulating layer has a via hole; and
an electrically conductive vertical interconnect disposed in the via hole;
wherein the vertical interconnect has a coefficient of thermal expansion that is equal to or less than a coefficient of thermal expansion of the insulating layer; and
wherein the insulating layer is multilayered, including at least a first dielectric layer having a first coefficient of thermal expansion and a second dielectric layer having a second coefficient of thermal expansion, wherein the first coefficient of thermal expansion is greater than the second coefficient of thermal expansion, and wherein the coefficient of thermal expansion of the insulating layer is a combined coefficient of thermal expansion of at least the first and second coefficients of thermal expansion.

2. The electrical device according to claim 1, wherein the second dielectric layer is a bonding layer, and wherein the first dielectric layer at least partially underlies the bonding layer.

3. The electrical device according to claim 2, wherein the bonding layer is $SiO_x$.

4. The electrical device according to claim 2, wherein the first dielectric layer is AlN or $Al_2O_3$.

5. An electrical device comprising:
a substrate;
an insulating layer supported by the substrate, wherein the insulating layer has at a via hole; and
an electrically conductive vertical interconnect disposed in the via hole;
wherein the vertical interconnect has a coefficient of thermal expansion that is equal to or less than a coefficient of thermal expansion of the insulating layer;
wherein the vertical interconnect includes a recessed cup in its upper surface; and wherein the recessed cup contains an electrically conductive contact having a coefficient of thermal expansion that is greater than the coefficient of thermal expansion of the vertical interconnect.

6. The electrical device according to claim 5, further comprising:
a fragile material at least partially underlying the vertical interconnect, the fragile material having a $K_{IC}$ fracture toughness of less than 1 MPa·m$^{1/2}$.

7. The electrical device according to claim 6, further comprising:
an electrically conductive contact pad between the fragile material and the vertical interconnect for conducting electricity therebetween.

8. The electrical device according to claim 5, wherein the vertical interconnect includes polysilicon.

9. The electrical device according to claim 8, wherein the electrically conductive contact includes indium.

10. The electrical device according to claim 5, wherein the electrical device is a photoconductor, and wherein the substrate comprises mercury cadmium telluride overlying silicon.

11. A 3D-integrated electrical device comprising
a first electrical device bonded and electrically integrated to a second electrical device, each of the electrical devices including:
a substrate;
an insulating layer supported by the substrate, wherein the insulating layer has a via hole; and
an electrically conductive vertical interconnect disposed in the via hole;
wherein the vertical interconnect has a coefficient of thermal expansion that is equal to or less than a coefficient of thermal expansion of the insulating layer;
the 3D-integrated electrical device comprising a hybrid vertical interconnect including:
a post made with a first electrically conductive material of the electrically conductive vertical interconnects of the first electrical device and the second electrical device, and
a contact disposed within a pocket of the post, the contact made with a second electrically conductive material,
wherein the first electrically conductive material has a coefficient of thermal expansion that is less than a coefficient of thermal expansion of the second electrically conductive material.

12. The 3D-integrated electrical device according to claim 11, wherein the post is made of polysilicon, and wherein the contact is made of metal.

13. The 3D-integrated electrical device according to claim 11,
wherein the first electrical device comprises a first insulating layer,
wherein the second electrical device comprises a second insulating layer, and
wherein the coefficient of thermal expansion of the post is equal to or less than respective coefficients of thermal expansion of the first and second insulating layers.

14. The 3D-integrated electrical device according to claim 13,
wherein each of the first insulating layer and the second insulating layer includes a $SiO_x$ bonding layer and an AlN and/or $Al_2O_3$ dielectric layer,
wherein the post includes polysilicon, and
wherein the contact includes indium.

15. The 3D-integrated electrical device according to claim 14, wherein the first electrical device is a photodetector, and wherein the second electrical device is a read out integrated circuit.

* * * * *